United States Patent [19]
Yamada et al.

[11] 3,965,288
[45] June 22, 1976

[54] AUTOMATIC TUNING APPARATUS

[75] Inventors: Yasuhiro Yamada, Neyagawa; Kazuyoski Tsukamoto, Hirakata; Yoshiaki Sakauchi, Nara; Takashi Tamura, Sakai; Yukio Saito, Higashiosaka, all of Japan

[73] Assignee: Sanyo Electric Co., Ltd., Japan

[22] Filed: Jan. 25, 1974

[21] Appl. No.: 436,536

[30] Foreign Application Priority Data
June 8, 1973 Japan.............................. 48-64943
June 8, 1973 Japan.............................. 48-64944
June 8, 1973 Japan.............................. 48-64945

[52] U.S. Cl............................. 178/5.8 A; 325/470; 325/423; 334/16; 331/36 C
[51] Int. Cl.²...................... H04N 5/60; H04B 1/32; H03J 1/02; H04B 3/04
[58] Field of Search..... 178/5.8 AF, 5.8 R, DIG. 15; 324/182; 325/422, 416, 418, 419, 420, 421, 452, 453, 458, 464, 465, 490, 468, 470; 334/11, 13, 14, 15, 16; 331/36 C, 36 R, 34

[56] References Cited
UNITED STATES PATENTS

| | | | |
|---|---|---|---|
| 3,588,706 | 6/1971 | Sakai et al. | 325/423 |
| 3,631,349 | 12/1971 | Rhee | 325/422 |
| 3,634,700 | 1/1972 | Worchester | 325/422 |
| 3,706,041 | 12/1972 | Krausser | 325/422 |
| 3,714,580 | 1/1973 | Close | 325/470 |
| 3,715,495 | 2/1973 | Takezaki et al. | 178/5.8 |
| 3,753,110 | 8/1973 | Ikeda et al. | 324/182 |
| 3,820,027 | 6/1974 | Maier | 178/DIG. 15 |

*Primary Examiner*—Benedict V. Safourek
*Assistant Examiner*—R. John Godfrey
*Attorney, Agent, or Firm*—Staas & Halsey

[57] ABSTRACT

An automatic tuning apparatus, such as an automatic channel selector as incorporated in a television receiver, comprising a tuner using a voltage controlled variable capacitance diode such that the variable capacitance thereof constitutes a portion of a tuning circuit of the tuner for changing the tuning frequency thereof, and a solid state electrochemical potential memory device, an output voltage of which is applied to the capacitance diode in a reverse direction, which memory device is controlled so as to be charged or discharged in response to selective manual operation until an increased or decreased terminal voltage thereof decreases or increases, respectively the capacitance across the diode and thus increases or decreases, respectively the tuning frequency of the tuner and a particular frequency is tuned. An intermediate frequency output, obtained as a result of tuning, is used to disable the abovementioned charging or discharging operation of the potential memory device.

30 Claims, 11 Drawing Figures

AUTOMATIC TUNING APPARATUS

BACKGROUND OF THE INVENTION

1. Field of the Invention

The present invention relates to an automatic tuning apparatus. More specifically, the present invention relates to an improved automatic tuning apparatus using a voltage controlled variable reactance device.

2. Description of the Prior Art

In reception of the television broadcast, it is necessitated to select a desired channel out of several television broadcast channels. One of the typical channel selectors so far employed in selection of television channels is a rotary switch. However, a rotary switch usually makes a circuit through a mechanical touch between paired contacts performed by a manual rotating operation. For this reason a rotary switch always suffers fatally from a poor electrical contact between the paired contacts caused by deterioration of the contact surfaces, a tiresome manual operation and a noise caused by rotating operation thereof. Another typical channel selector suitable for selection of television channels is a multi-circuit push-button switch. Again, however, the push-button switch involves the same shortcoming of a poor electrical contact on the same ground as a rotary switch.

Recently a television channel selecting apparatus for selecting VHF television channels employing a voltage controlled variable capacitor has been proposed and will be expected to be widely used in the future. Such a voltage controlled variable capacitor uses a capacitance formed at a barrier portion of a diode, variable as a function of a reverse voltage applied thereto, and is also known as a variable capacitance diode. In such a television channel selecting apparatus, it is necessary to provide a voltage supply capable of providing a plurality of different voltages in response to manual operation each corresponding to a value which causes a respective capacitance valve in accordance with which the television channel selecting apparatus selects a desired corresponding channel. One type of such a voltage supply for providing a plurality of different voltages comprises a reference voltage source and a plurality of potential dividers for dividing the voltage of the source, each being selectively operable in response to individual manual operation. Another type of such a voltage supply for providing different voltages to a variable capacitance diode comprises a capacitor and a charging/discharging circuit therefor, a voltage across the capacitor, as selected in response to an output of the channel selecting apparatus, being applied to the variable capacitance diode. More specifically, the capacitor is charged or discharged by the charging/discharging circuit until a voltage across the capacitor causes capacitance in the diode in accordance with which the selector selects a corresponding television channel to provide a tuning output therefrom when the charging/discharging circuit is disabled and no longer continues to charge or discharge the capacitor, so that the voltage thus provided across the capacitor remains the same. If another channel is desired, the charging/discharging circuit is again enabled through manual operation and the abovementioned operation is repeated until another channel is selected. Nevertheless, the voltage across the capacitor gradually becomes lower because of leakage through an undesired leakage path, which causes detuning of the selecting apparatus and thus results in a poor quality of picture on a screen of a cathode ray tube of the television receiver. In order to solve such a problem it is required to provide a circuit for compensating the decrease in voltage across the capacitor because of leakage, which makes the circuit complicated and the system expensive. Another disadvantage in the television channel selecting apparatus using a variable capacitance diode supplied with a voltage across the capacitor is that the voltage across the capacitor is charged or discharged in an exponential manner rather than in a linear manner, which makes it difficult to achieve precise automatic tuning. It is desired that an improved voltage supply source for providing different voltages to a variable capacitance diode is provided, which is suited for employment in an automatic tuning apparatus.

A voltage storing device of interest in connection with the present invention is disclosed in U.S. Pat. No. 3,735,110, issued Aug. 14, 1973 to Hironosuke Ikeda et al. and assigned to Sanyo Electric Co., Ltd. the same assignee as that of the present invention. As set forth in the referenced patent, Professor Takehiko Takahashi and Assistant Professor Osamu Yamamoto, Technological Department of Nagoya University, announced their study on the electrochemical potential memory device by the use of a solid state electrolyte at the 22nd annual assembly of Japan Chemical Association held on Apr. 5 to 7, 1969. Briefly stated, this device comprises an Ag electrode as a cathode, an Ag—Te alloy electrode as an anode, and a solid state electrolyte having high ion conductivity, such as $RbAg_4I_5$ sandwiched between both electrodes. When a DC voltage is applied to the device so that the Ag electrode may be negative, a portion of Ag contained in the Ag—Te alloy electrode migrates over to the Ag electrode, resulting in a decreased activity of Ag in the Ag—Te alloy, and thus an increased potential difference between both electrodes. The inventors of this device termed this states of operation as "charging". When the polarity of the applied DC voltage is reversed to that of the former case, Ag is refilled into the Ag—Te alloy, resulting in the decreased potential difference and returns to the initial value eventually. The inventors of this device termed this state of operation as "discharging". Study disclosed by the inventors of this device indicates that the electromotive force generated by the abovementioned charging or discharging current can cause linear change to some extent with respect to the charging or discharging time. Thus, this device makes it possible as an outstanding characteristic to do write-in and non-destructive read-out operation while preserving relatively linear relation between the charging or discharging time and terminal voltage, and in addition, it can hold the memory condition for a relatively longer period of time. These advantages mean that this device has opened a way for its potential use as an analogue memory device. The referenced patent further discloses an improved electrochemical potential memory device. More specifically, FIG. 6 of the referenced patent shows an improved electrochemical potential memory device for eliminating the IR drop across the resistance in the electrolyte and the overvoltage caused by dissolution or deposition of Ag, which is basically characterized by the provision of an auxiliary cathode that comprises an output terminal for detecting the potential separately from the abovementioned cathode avaiable for the input terminal for the current conduction.

In view of these advantageous characteristics of the abovementioned memory device, it may be possible to utilize this device as an essential component of a solid state variable voltage supply source. The present invention has thus been accomplished by the inventors in order that such possibility may be realized.

SUMMARY OF THE INVENTION

Briefly stated, the present invention comprises an automatic tuning apparatus comprising a solid state electrochemical potential memory device for providing different voltages to a voltage controlled variable reactance device coupled or associated, with a tuning circuit of the automatic tuning apparatus and a control circuit controllable in response to an output of said tuning circuit for selectively charging or discharging said potential memory device. The said control circuit may be manually operable for enabling the control circuit. The said control circuit is preferably controlled responsive to a threshold detector such that the charging or discharging operation of the potential memory device may be reversed in response to a threshold detection output of the terminal voltage of the potential memory device as at an upper threshold and a lower threshold.

The said solid state electrochemical potential memory device exhibits a terminal voltage between an anode and a cathode linearly changing as a function of the charging or discharging quantity of electricity fed to said device, and is capable of holding the terminal voltage. Accordingly, the characteristic features of the solid state electrochemical potential memory device can advantageously combined be with an automatic tuning apparatus using a voltage controlled variable reactance device, such as a voltage controlled variable capacitance diode.

Therefore, a principal object of the present invention is to provide an improved automatic tuning apparatus using a voltage controlled variable reactance device supplied with a control voltage by a solid state electrochemical potential memory device.

Another object of the present invention is to provide an automatic tuning apparatus capable of achieving an automatic tuning operation with precision.

A further object of the present invention is to provide an automatic tuning apparatus suitable for use in a television receiver.

Still a further object of the present invention is to provide an automatic tuning apparatus using a voltage controlled variable reactance device supplied with a control voltage by a solid state electrochemical potential memory device, which is also used for the purpose of automatic frequency control.

These objects and other objects and features of the present invention will be better understood when taken in conjunction with the following detailed description made with reference to the accompanying drawings.

BRIEF DESCRIPTION OF THE DRAWINGS

In the drawings, the like reference characters designate the like portions.

DESCRIPTION OF THE PREFERRED EMBODIMENTS:

As described in the foregoing section of Description of the Prior Art, the present invention utilizes the prior art electrochemical potential memory device including a solid state electrolyte. As described already, this device has a significant characteristic of the terminal voltage or electromotive force changing in an approximately linear way with respect to the charging or discharging quantity of electricity flowing therethrough. Accordingly, prior to a detailed description of the present invention, it would be appropriate to give a more detailed description of such a electrochemical potential memory device.

Figure 1:
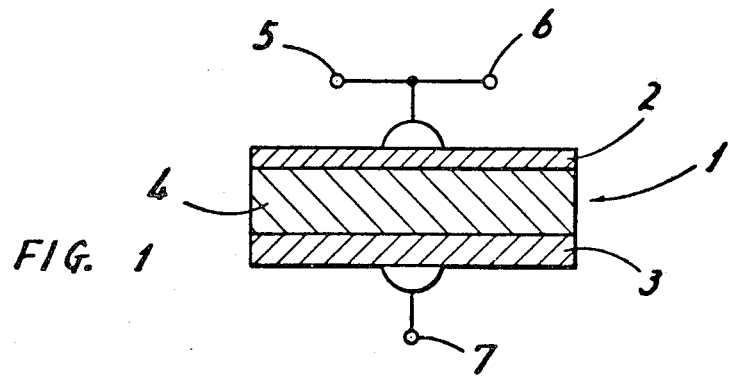
FIG. 1 illustrates a schematic sectional view of an electrochemical potential memory device to be used in the apparatus of the present invention.

FIG. 1 illustrates a schematic sectional view of an electrochemical potential memory device 1 which is used in the apparatus of the present invention. It may be considered that this device is a kind of cell which comprises a solid state electrolyte 4 of high ion conductivity, such as $RbAg_4I_5$ or $Ag_3SI$, sandwiched by a cathode 2 mainly including silver (Ag) and an anode 3 mainly including an alloy of silver and a member selected from the group consisting of sulfur (S), selenium (Se) and tellurium (Te), preferably an Ag—Te alloy. When a DC voltage is applied between both electrodes 2 and 3 of this device 1 through an input terminal 5 and a common terminal 7, respectively, in such a way that the anode 3 of this device may be positive and the cathode 2 may be negative, silver contained in the Ag—Te alloy in the anode 3 is ionized to be dissolved into the solid state electrolyte 4 and is deposited on the cathode 2. In this specification, such a state of operation is referred to as "charging" hereinafter. When a DC voltage is applied to the abovementioned device in the directly opposite polarity to the above case, silver deposited over the cathode 2 migrates onto the anode 3 and is deposited thereupon. In this specification, such a state of operation is referred to as "discharging" hereinafter.

Figure 2:
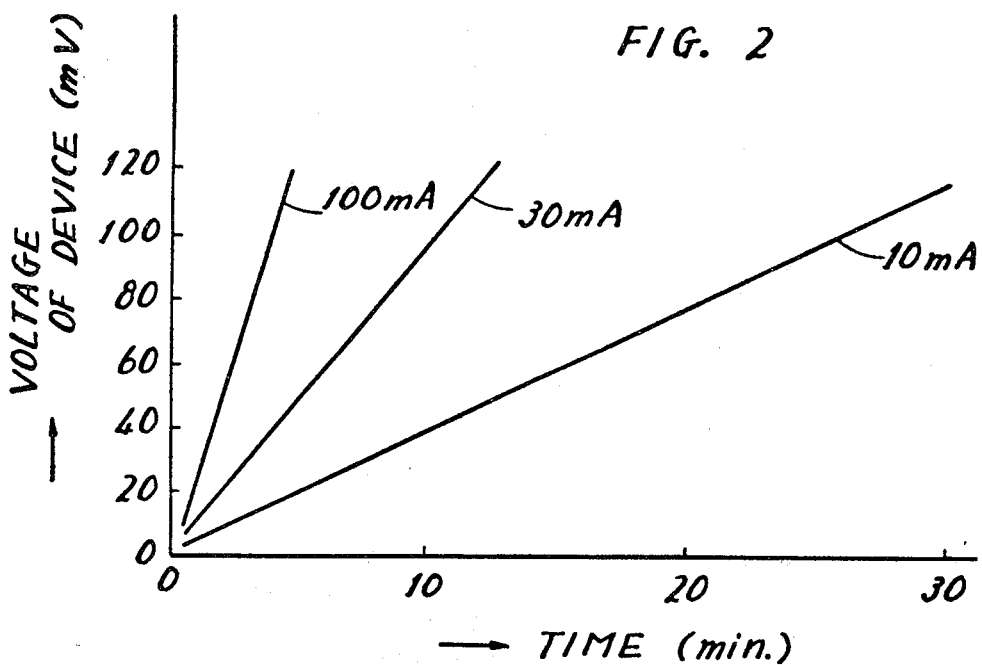
FIG. 2 is a graph which indicates a relation between the charging or discharging time, and thus the quantity of electricity, and the electromotive force of the FIG. 1 device, by taking the current for charging or discharging the device as a parameter.

FIG. 2 is a graph which indicates the relation between the charging or discharging time, and thus the quantity of electricity, and the electromotive force of the abovementioned device, as detected between the both electrodes 2 and 3 through an output terminal 6 and the common terminal 7, respectively, by taking the current for charging or discharging the device as a parameter. As illustrated in FIG. 2, the following facts of function have been clarified; that the electromotive force of this device as a cell indicates the value dependent upon the activity of silver contained in the Ag—Te alloy of cathode 3, that the activity of silver varies to a large measure by any slight charging or discharging performance when the atomic composition ratio of silver and tellurium contained in the Ag—Te alloy approximates to a value of 2, and that the relation between the abovementioned electromotive force and the charging or discharging quantity of electricity $i \cdot t$, where $i$ is a current value and $t$ is time, generally indicates a linear relation during the charging or discharging period in case of the electromotive force of relatively low voltage range (from 0(zero) to 100mV. as per the embodiment illustrated in FIG. 2) and also in case of the current density of relatively low order (less than $100\mu A/cm^2$ as per the embodiment illustrated in FIG. 2). In this connection, it is to be pointed out that application of a given voltage to the device in either charging or discharging manner causes substantially a constant current to flow therethrough and therefore the said linear relation is also applicable to the characteristic between the terminal voltage of the device and the charging or discharging time.

It has further been known that this device has an additional characteristic capable of holding the potential as established immediately before cutting-off the current after the cutting-off of the current supplied to this device, for the abovementioned voltage range (from 0(zero) to 100mV. as per the embodiment illustrated in FIG. 2).

Accordingly, the present invention is directed to providing an automatic tuning apparatus in which a tuning function is achieved by providing different terminal voltages of the device, selected as desired, to a voltage controlled variable reactance device which constitutes a part of a tank circuit, by the skillful use of the advantageous characteristic of the device being capable of holding the selected potential.

It is understood that the embodiments described with reference to FIG. 1 includes terminals 5 and 6 connected in common to a single cathode 2 by means of which the charging or discharging current is supplied and also the terminal voltage of the device is detected. In this connection it is recalled that the device shown in FIG. 1 can be considered as a cell, as mentioned previously. Therefore, in case of such device as comprising a common cathode for supply of the current and for detection of the terminal voltage, the detected output voltage is a total of an electromotive force of the device and of an overvoltage of the device as a cell. This results in the fact that the initiation or the termination of the electric current conduction into the device causes influence of the overvoltage on the detected voltage and therefore the output voltages detected at the device 1 immediately before and after the change of electrical current conduction state are different. This means that the voltage holding characteristic of the device is degraded. It has been found that the said degradation of the voltage holding characteristic is aggravated by the fact that an increased current for charging and discharging the device causes a greater overvoltage, resulting in more inaccurate tuning. Thus it is desired to provide an improved potential memory device that eliminates the abovementioned problem.

The overvoltage as occurs in the electrochemical potential memory device causing a voltage drop after the cutting-off, or termination of the current conduction into the device may be classified as follows:

1. A voltage drop caused by the current flowing through the resistance involved in the solid state electrolyte of the device (or an IR drop across the resistance in the electrolyte).
2. An overvoltage caused by dissolution or deposition of Ag at an interface between the electrolyte and the anode or cathode.
3. An overvoltage caused by diffusion of Ag ion into the anode.

Figure 3:
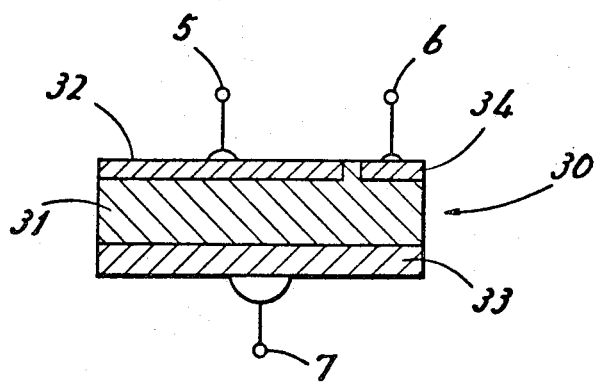
FIG. 3 shows a schematic sectional view of an improved electrochemical potential memory device for eliminating the IR drop across the resistance in the electrolyte and the overvoltage caused by dissolution or deposition of Ag.

FIG. 3 shows a schematic sectional view of an improved electrochemical potential memory device 30 for eliminating the IR drops across the resistance in the electrolyte as described in the above subsection (1) and the overvoltage caused by dissolution or deposition of Ag as described in the above subsection (2). The device 30 shown in FIG. 3 is basically characterized by the provision of an auxiliary cathode 34 that comprises an output terminal 6 for detecting the potential separately from the abovementioned cathode 32 available for the input terminal 5 for the curent conduction. More specifically, the device shown in FIG. 3 essentially comprises a solid electrolyte 31 composed of $Ag_3SI$, an anode 33 composed of an Ag—Te alloy, a cathode 32 composed of Ag, and an auxiliary cathode 34 composed also of Ag.

Figure 4:
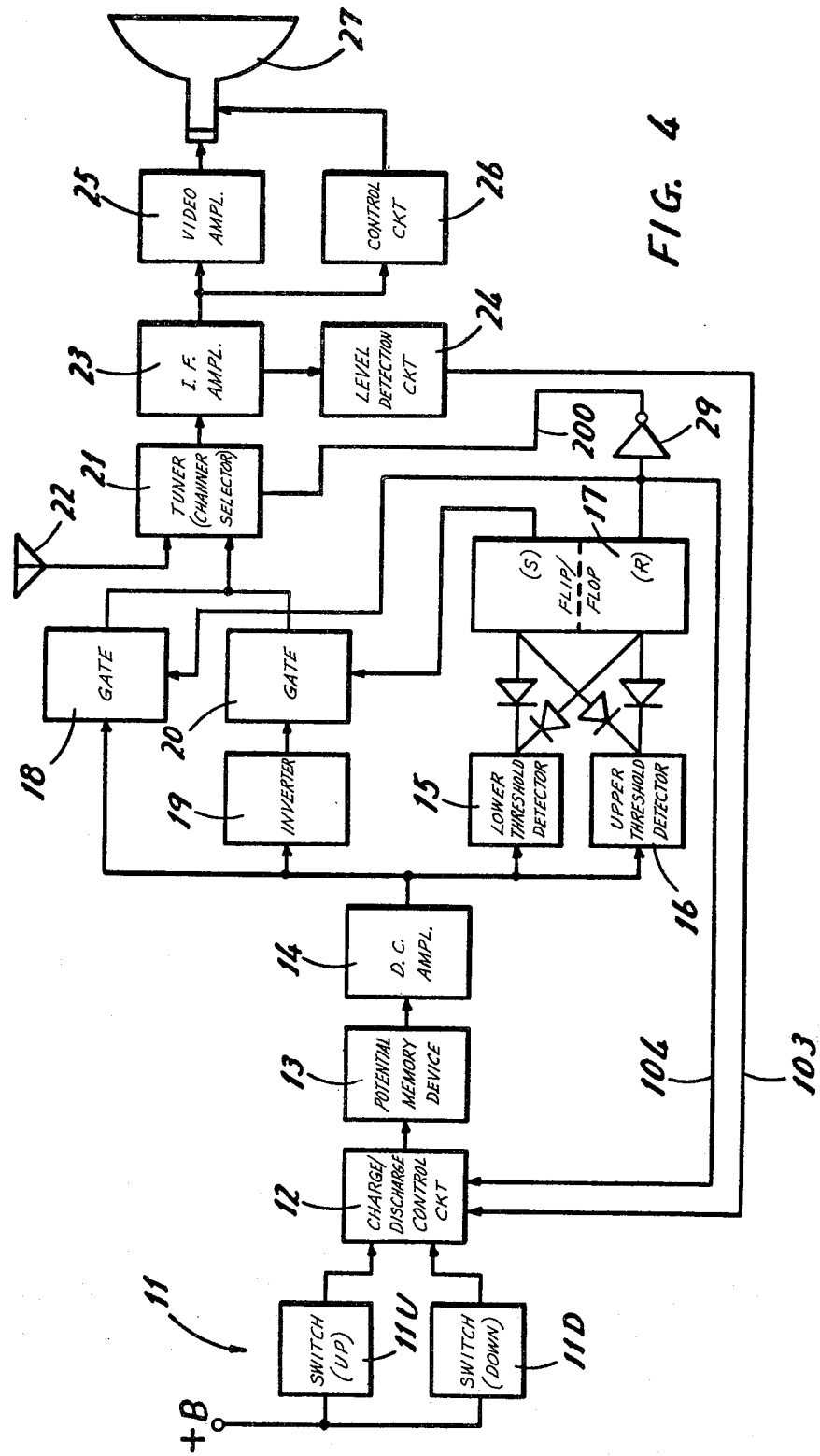
FIG. 4 illustrates a block diagram of a televison receiver embodying the present invention using the abovementioned potential memory device.

FIG. 4 illustrates a block diagram of a television receiver embodying the present invention using the abovementioned potential memory device. A typical television receiver is shown in the right half portion of the FIG. 4 diagram, which comprises an antenna 22, a tuner or channel selector 21, an intermediate frequency amplifier 23, a video amplifier 25, a cathode ray tube 27 and a control circuit 26. The turner or channel selector 21 usually comprises a high frequency amplifier, a local oscillator and a mixer. For the purpose of embodying the present invention, the channel selector 21 of the television receiver shown, further comprises voltage controlled variable reactance devices, which are connected so as to constitute a part of a tuning circuit for the high frequency amplifier and the local oscillator, as to be more fully described hereinafter. A typical and preferred voltage controlled variable reactance device of a solid state type now commerically available is a voltage controlled variable capacitor. As described in the foregoing, such a voltage controlled variable capacitor uses a capacitance formed at a barrier portion of a semiconductor diode, which is variable as a function of a reverse voltage applied thereacross, and is also known as a variable capacitance diode. However, it should be understood that any type of voltage controlled variable reactance device can be used for the purpose of the present invention, so far as it is available. The control circuit 26 of a typical monochrome television receiver comprises a synchronizing pulse circuit, vertical and horizontal deflection circuits, a high voltage circuit, or the like, required for operation of the cathode ray tube 27. If the present invention is employed in a color television receiver, then the control circuit 26 might further comprises such additional circuits as required for reception of the color television signal.

FIG. 4 also shows in the left half portion thereof an embodiment of an automatic tuning apparatus incorporated in the abovementioned television receiver. Briefly stated, the automatic tuning apparaus shown is enabled to start automatic tuning operation by manual operation of a switch, which causes the abovementioned potential memory device to be charged or discharged and the resulting variable voltage thereacross is applied to the voltage controlled variable capacitance diode connected to and thus associated with tunning circuits in the channel selector, until a desired one of the broadcasting channels is selected as a result of tuning in the channel selector, when a tuning output is obtained in a form of an intermediate frequency signal from the intermediate frequency amplifier, which is used to stop charging or discharging of the potential memory device, with the result that a television channel is automatically selected. A further detailed description of the automatic tuning apparatus shown is given in the following with particular reference to the left half portion of the FIG. 4 diagram.

Referring again to FIG. 4, the automatic tuning device comprises a manually operable switch 11 for starting the scanning of the television channels, which comprises an upward scanning switch 11U and a downward scanning switch 11D, both of which are energized by a + B voltage source. A charging/discharging control circuit 12 is provided to control charging or discharging of a potential memory device 13 as a function of an output from switches 11U or 11D and a disabling signal associated with an output from the intermediate frequency amplifier, as to be described hereinafter. An output of the potential memory device 13 is supplied to a DC amplifier 14. An output from the amplifier 14 is fed through a gate 18 to the channel selector 21 and also through an inverter 19 and a gate 20 to the channel selector 21. In the channel selector 21, an output from either of the gates 18 and 20 is fed to the voltage controlled variable capacitor in a reverse direction, as to be more fully described hereinafter. An output from the amplifier 14 is also fed to lower threshold detector 15 and an upper threshold detector 16, so that either of outputs from detectors 15 and 16 in response to a predetermined lower threshold or upper threshold of the output from the amplifier 14 sets or resets a flip-flop 17, respectively, by means of a diode connection, as shown. A reset output of the flip-flop 17 is connected to the gate 18 to allow the amplified voltage signal to pass therethrough and a set output of the flip-flop 17 is connected to the gate 20 to allow the amplified and inverted voltage signal to pass therethrough to the channel selector 21. The reset output of the flip-flop 17 is also connected to the charging/discharging control circuit 12, so that the circuit 12 is caused to reverse the charging or discharging operation mode.

Figure 5:
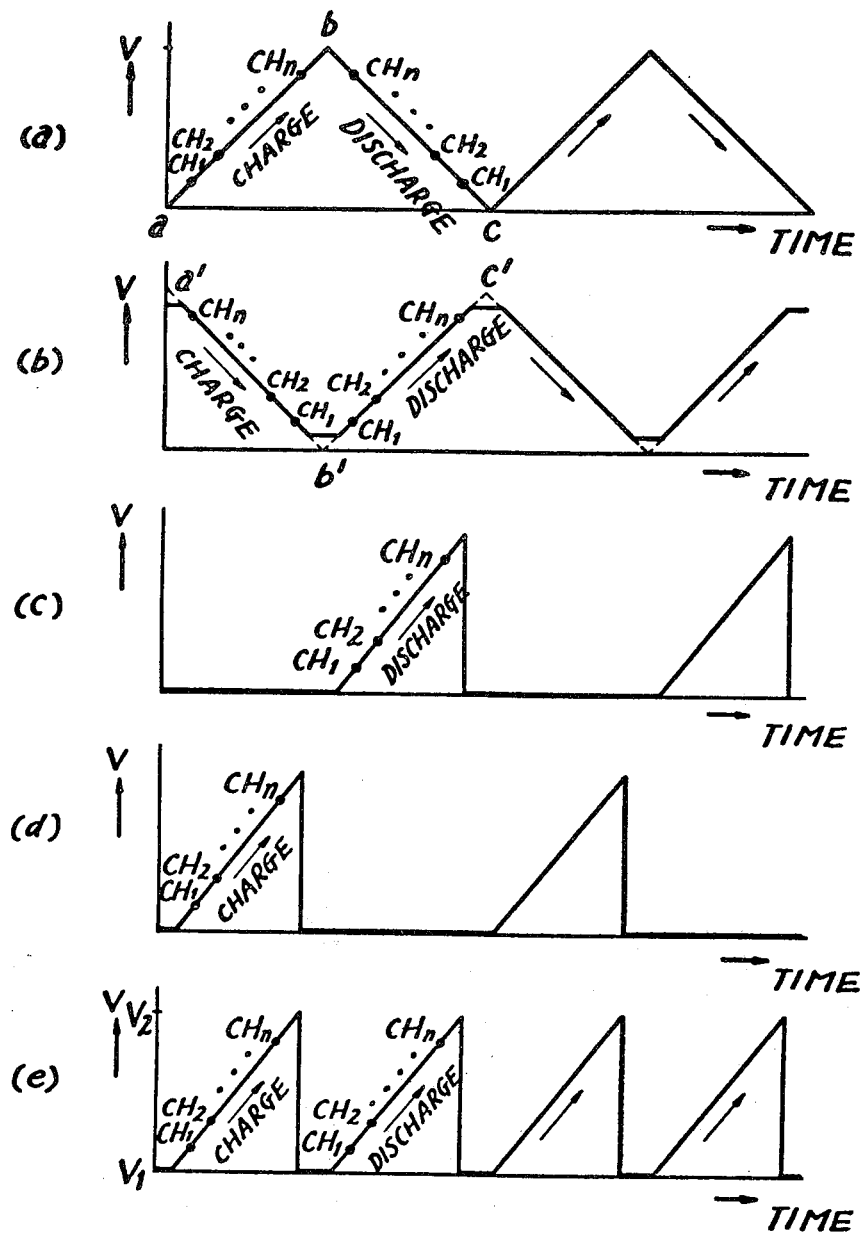
FIG. 5 shows a relation between voltages appearing at various portions in FIG. 4 diagram and the lapse of time.

The operation of the FIG. 4 embodiment will be better understood by the following description with simultaneous reference to FIG. 5, which shows a relation between voltages appearing at various portions in FIG. 4 diagram and the lapse of time. For the purpose of describing the operation of the embodiment shown, first let it be assumed that only the upward scanning switch 11V is manually operated. Further let it be assumed that no television signal has been broadcast in any channel. FIG. 5 (a) shows a relation of the output voltage of the potential memory device 13 and the lapse of time in operation of the inventive apparatus in such a situation. More specifically, when the upward scanning switch 11U is manually operated, the charging/discharging control circuit 12 is enabled to be in a charging mode and thus the potential memory device 13 is charged, as specifically defined in the present specification. A change in the voltage at the output terminal of the device 13 is shown in FIG. 5 (a) as from the origin a to a point b. If the device 13 had been caused to continue further the charging mode, then the device 13 would have been destroyed because of overcharging. However, in the embodiment shown, an output from the DC amplifier 14, which corresponds to the voltage of the device 13 at the point b but which has been amplified and inverted by the amplifier 14, is threshold-detected by the lower threshold detector 15 to cause the flip-flop 17 to be set. Therefore, no reset output from the flip-flop 17 is applied thereafter through a line 104 to the charging/discharging control circuit 12 so that the control circuit 12 is caused to be in a discharging mode, and thus the potential memory device 13 is discharged thereafter, as specifically defined in the present specification. A change in the voltage at the output terminal of the device 13 during this period of time is shown in FIG. 5 (a) as from the point b to the point c. In the embodiment shown, an output from the DC amplifier 14, which corresponds to the voltage of the device 13 at the point c but which has been amplified and inverted by the amplifier 14, is threshold-detected by the upper threshold detector 16 to cause the flip-flop 17 to be reset. The reset output from the flip-flop 17 is applied thereafter through a line 104 to the charging/discharging control circuit 12 so that the control circuit 12 is caused to be in a charging mode again. Thereafter the same operation is repeated as mentioned above. FIG. 5 (b) shows a change in the voltage at the output of the DC amplifier 14, in which the points $a'$, $b'$ and $c'$ correspond to the points $a$, $b$ and $c$, respectively, in the graph of FIG. 5 (a).

It is understood from the foregoing description that in a time period of the charging mode a set output is provided from the flip-flop 17 to enable the gate 20 and in a time period of the discharging mode a reset output is provided from the flip-flop 17 to enable the gate 18. Therefore, in the discharging mode period of time an output from the Dc amplifier 14 is allowed to pass through the gate 18 to the channel selector 21. An output from the gate 18 is shown in FIG. 5. (c). On the other hand, in the charging mode period of time an output from the DC amplifier 14 is allowed, after inverted by the inverter 19, to pass through the gate 20 to the channel selector 21. An output from the gate 20 is shown in FIG. 5 (d). As a result, the channel selector 21 will receive a combined output of those outputs from gates 18 and 20, a waveform of which is shown in FIG. 5 (e).

As described previously, in the channel selector 21, the said combined output is applied to voltage controlled variable capacitors connected to and thus associated with the tuning circuits for a high frequency amplifier and a local oscillator. Therefore, it is understood that it is necessary to choose a range of change in voltage (V1 to V2) as shown in FIG. 5 such that the said range suffices to cover voltage values which are required to receive all the television channels by the use of the channel selector 21 employing the said voltage controlled variable capacitor so as to be supplied with the said voltage values. It is to be pointed out that in FIG. 5 voltage values corresponding to frequencies of carrier waves of television channels are shown as at CH1, CH2, CH3 . . . CHn.

Now let it be assumed that some television broadcasting stations are broadcasting using different channels in a certain area. Further let it be assumed that the potential memory device 13 has been discharged to a point $a$. When the upward scanning switch 11U is manually operated, the inventive automatic tuning apparatus is caused to be in a charging mode, or an upward scanning mode. When a voltage at the output terminal of the potential memory device 13 comes to a level which corresponds to a frequency of a carrier wave in which a television signal has been broadcasted, The channel selector automatically tunes to the frequency and selects the channel, so that an intermediate frequency output is provided at the intermediate frequency amplifier 23 and an output is provided from the level detection circuit 24. The output from the detection circuit 24 is fed to the charging/discharging control circuit 12 to disable it so that charging mode is discontinued thereafter. Such a state as thus established is kept unchanged and thus the voltage of the memory device 13 remains the same until a further manual operation of the switch 11U. Upon such a manual operation of the switch 11U, the charging/discharging control circuit 12 is again forced in an enabled condition of the charging mode, so that the television bands are scanned in the abovementioned manner from the lower frequency channel to the higher frequency channel, until another channel currently broadcasting is selected by the channel selector 21. When the voltage to be supplied to the channel selector comes to be V2, the state of the flip-flop 17 is changed so that the charging/discharging control circuit 12 is controlled to be in a discharging mode. In the embodiment shown, however, a voltage feeding path is switched from the gate 18 to the inverter 19 and the gate 21 in the discharging mode period of time as a function of the output from the flip-flop 17. This makes the tuning to be effected again from the lower frequency channel to the higher frequency channel even in the discharging mode period upon manual operation of the switch 11U, as to be more fully described subsequently.

In the foregoing description it was assumed that only the upward scanning switch 11U was operated. The upward scanning switch 11U should be so constructed that it enables the control circuit 12 to be in a charging mode during the charging mode period and also to be in a discharging mode during the discharging mode period. It is understood that the upward scanning switch 11U is only used for the purpose of enabling the control circuit 12 to be in a upward scanning mode, i.e. in a mode in which scanning is effected from the lower frequency channel to the higher frequency channel. In the embodiment shown, the downward scanning switch 11D is also provided. The downward scanning switch 11D should be so constructed that it enables the control circuit 12 to be in a discharging mode during the charging mode period and also to be in a charging mode during the discharging mode period. It is understood that the downward scanning switch 11D is only used for the purpose of enabling the control circuit 12 to be in a downward scanning, i.e. in a mode in which scanning is effected from the higher frequency channel to the lower frequency channel.

In a different embodiment either of the switches 11U and 11D may be omitted such that scanning in only a single direction can be effected. In a further embodiment the output from the DC amplifier 14 may be directly applied to the channel selector 21. It is readily understood that in such an embodiment manual operation of the switch 11U causes scanning from the higher frequency channel to the lower frequency channel in the charging mode and from the lower frequency channel to the higher frequency channel in the discharging mode, while manual operation of the switch 11D causes scanning from the lower frequency channel to the higher frequency channel in the charging mode and from the higher frequency channel to the lower frequency channel in the discharging mode.

In the foregoing description it was assumed that a range of variable capacitance of the voltage controlled variable capacitance diode suffices to cover the corresponding frequency range of VHF television channels No. 1 to No. 12 for the Japanese Television Standard. In actuality, however, it is rather difficult to cover the full range of frequency for all VHF television channels by using a channel selector employing a typical voltage controlled variable capacitance diode now commercially available. Therefore, the embodiment shown further comprises a circuit for automatically changing the channel selector 21 to a lower frequency channel band, i.e. Channel Nos. 1 to 3, or to a higher frequency channel band, i.e. Channel Nos. 4 to 12. Such a band changing control circuit comprises an inverter 29 connected to the flip-flop 17 and a line 200 connected to the channel selector 21.

For the purpose of description of the circuit, let it be assumed that the channel selector 21 is operating to scan the lower frequency channel band from a lower frequency to a higher frequency. In that situation the flip-flop 17 has been reset, as described previously. Therefore, a reset output of a high level is applied to the inverter 29 and thus an inverted output of a low level is applied therefrom to the channel selector 21 through the line 200. The channel selector 21 has been so constructed that the said low level output at the line 200 causes the selector to operate in a lower frequency channel band. When the potential memory device 13 is charged to an upper limit, an inverted and amplified output from the amplifier 14 is threshold-detected by the lower threshold detector 15 to set the flip-flop 17, which changes the signal path from via the gate 18 to via the inverter 19 and the gate 20 and at the same time an inverter output of a high level is applied from the inverter 29 to the channel selector 21 through the line 200. The high level output from the inverter 29 causes the channel selector 21 to operate in a higher frequency channel band. Channel scanning is effected from a lower frequency to a higher frequency in the high frequency channel band because of interposition of the inverter 19, although the potential memory device 13 is discharged in this period of time. When the potential memory device 13 is discharged to a lower limit, an inverted and amplified output from the amplifier 14 is threshold-detected by the upper threshold detector to reset the flip-flop 17, which changes the signal path from via the inverter 19 and the gate 20 to via the gate 18 and at the same time an inverted output of a low level is applied from the inverter 29 to the channel selector 21 through the line 200. Thus a full cycle of channel scanning in both the lower frequency channel band and the high frequency channel band is completed.

Figure 6:
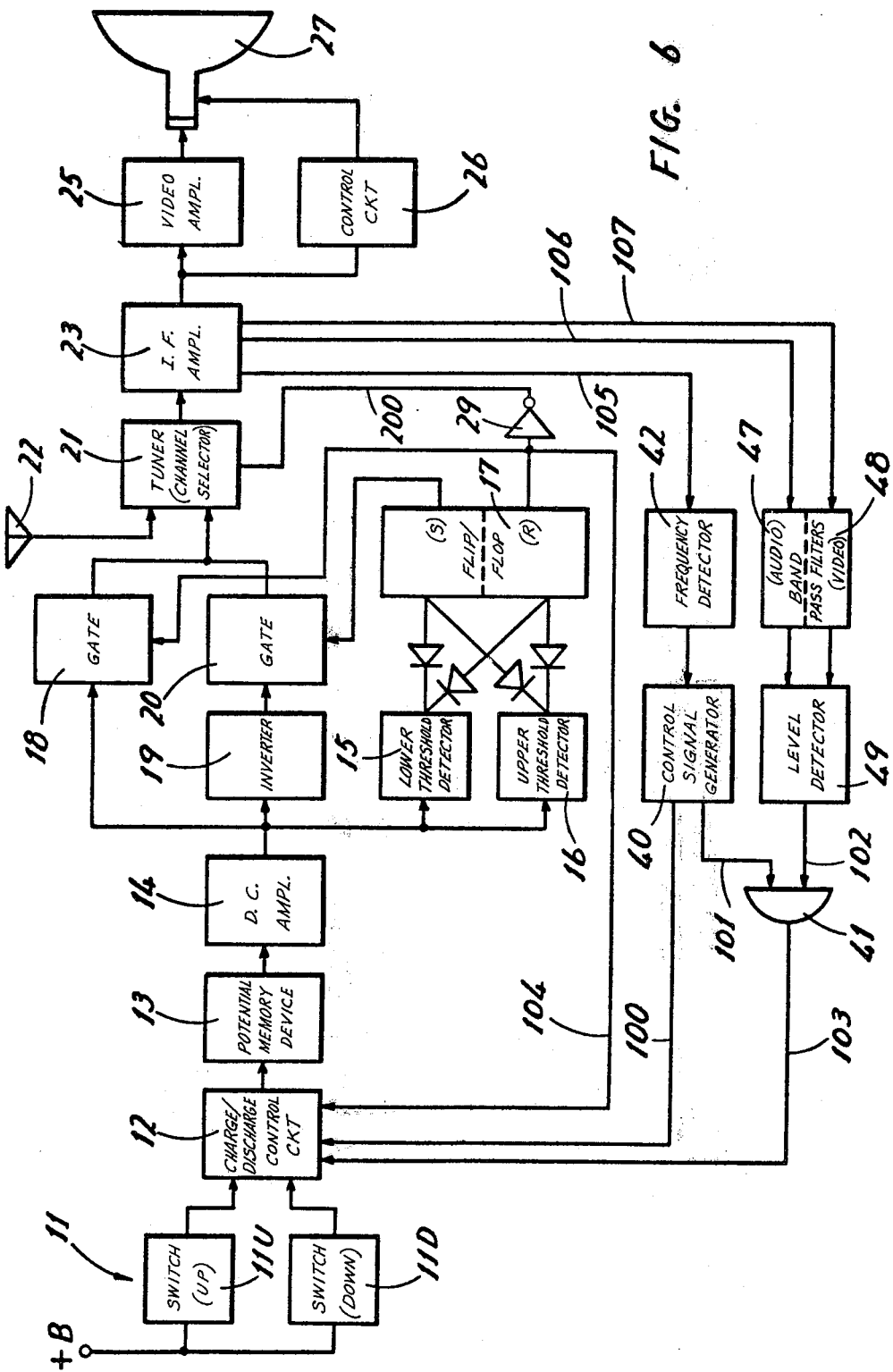
FIG. 6 shows a block diagram of a television receiver employing a preferred embodiment of the present invention using the abovementioned potential memory device.

FIG. 6 shows a block diagram of a television receiver employing a preferred embodiment of the present invention using the abovementioned potential memory device. The embodiment shown in FIG. 6 comprises an automatic frequency control in addition to the FIG. 4 embodiment. Therefore, the same portions as those in FIG. 4 embodiment are denoted by the same reference characters. In the following only an additional implementation will be described, while detailed description as to the same portions as those of FIG. 4 embodiment will be omitted. With specific reference to the lower portion of the FIG. 6 diagram, the embodiment shown additionally comprises a frequency detector 42 such as a ratio detector coupled to the intermediate frequency amplifier 23 for detecting the frequency of the intermediate frequency output, a charging/discharging control signal generating circuit 40 coupled to the frequency detector 42 for providing a charging/discharging control signal to the control circuit 12 responsive to the output from the frequency detector 42, band-pass filters 47 and 48 for selectively withdrawing the sound and video components, respectively, of the intermediate frequency output from the amplifier 23, a level detector 49 for simultaneous detection of the level of the sound and video thus chosen, and an AND gate 41 responsive to the outputs from the signal generator 40 and the level detector 49 for providing a disabling signal for disabling the control circuit 12.

In operation, first let it be assumed that the tuning circuits in the channel selector 21 have been precisely tuned to the frequency of a desired channel. The sound and video components of the intermediate frequency output from the amplifier 23 are allowed to pass through the band pass filters 47 and 48, respectively, sufficiently enough to be level-detected by the level detector 49, so that simultaneous detection of both of the sound and video components provides an output at a line 102 of the level detector 49. On the other hand, the intermediate frequency output from the amplifier 23 is frequency-detected by the frequency detector 42 and, if the intermediate frequency output is of the precise frequency, an output signal is obtained at a line 101 of the output of the signal generator 40. Therefore, an input condition of the AND gate 41 is met to provide an output at a line 103 of the output of the gate 41, which is applied to the control circuit 12 as a disabling signal, so that the control circuit 12 is disabled thereby to discontinue thereafter either a charging or discharging mode of the potential memory device 13. Consequently a DC voltage value to be applied to the voltage controlled variable capacitor in the channel selector 21 is fixed to a desired fixed value. Now let it be assumed that a slight detuning occurs in the channel selector 21. Because of the said detuning in the channel selector 21, the frequency of the intermediate frequency output from the amplifier 23 is also fluctuated and thus an output from the frequency detector 42 is accordingly changed, such that no output is obtained at the line 101 of the output of signal generator 40, and thus no disabling output is provided at the line 103 of the output of the AND gate 41, and therefore the control circuit 12 is enabled. On the other hand, fluctuation in frequency upward or downward causes the signal generator 40 to provide a discharging or charging control signal, respectively, at the line 100 which causes the control circuit 12 to be in a discharging or charging mode so that the potential memory device 13 is discharged or charged depending upon the upward or downward fluctuation in frequency of the intermediate frequency output. Discharging of the potential memory device 13 decreases the voltage at the output terminal of the device and thus makes the frequency of the intermediate frequency output lower, whereas charging of the potential memory device 13 increases the voltage at the output terminal of the device and thus makes the frequency of the intermediate frequency output higher. If the channel selector 21 is precisely tuned again and thus the intermediate frequency output of the precise frequency is obtained from the amplifier 23, a disabling output is obtained from the AND gate 41 again, so that the control circuit 12 is disabled, and thus discontinues the charging or discharging operation of the device 13. As a result an automatic frequency control is achieved and thus precise tuning can be effected in an automatic manner in the inventive automatic tuning apparatus using a voltage controlled reactance device in combination with the abovementioned potential memory device.

In the FIG. 6 embodiment, both the sound and video components in the intermediate frequency output are withdrawn by means of the band-pass filters 47 and 48, respectively, and simultaneous level detection of them is used for the purpose of disabling the charging/discharging control circuit 12. Such simultaneous level detection of two components in the intermediate frequency output is preferred, in view of the fact that the intermediate frequency output comprises such two components. If only the video component had been used for the purpose of disabling the control circuit 12, then it could have occurred that the sound component be erroneously used for disabling the control circuit 12, which would have caused mistuning. It should be understood that in the FIG. 4 embodiment as well such simultaneous detection of the sound and video components is preferably obtained in the level detector 24 for providing a disabling signal at the line 103. Alternatively, however, simultaneous detection of the sound component and a synchronizing pulse output or simultaneous detection of the video component and a synchronizing pulse output may be used for disabling the control circuit 12. Such a synchronizing pulse output may be of either a horizontal synchronizing pulse or a vertical synchronizing pulse and is available from a synchronizing pulse circuit of a typical television receiver.

Figure 7:
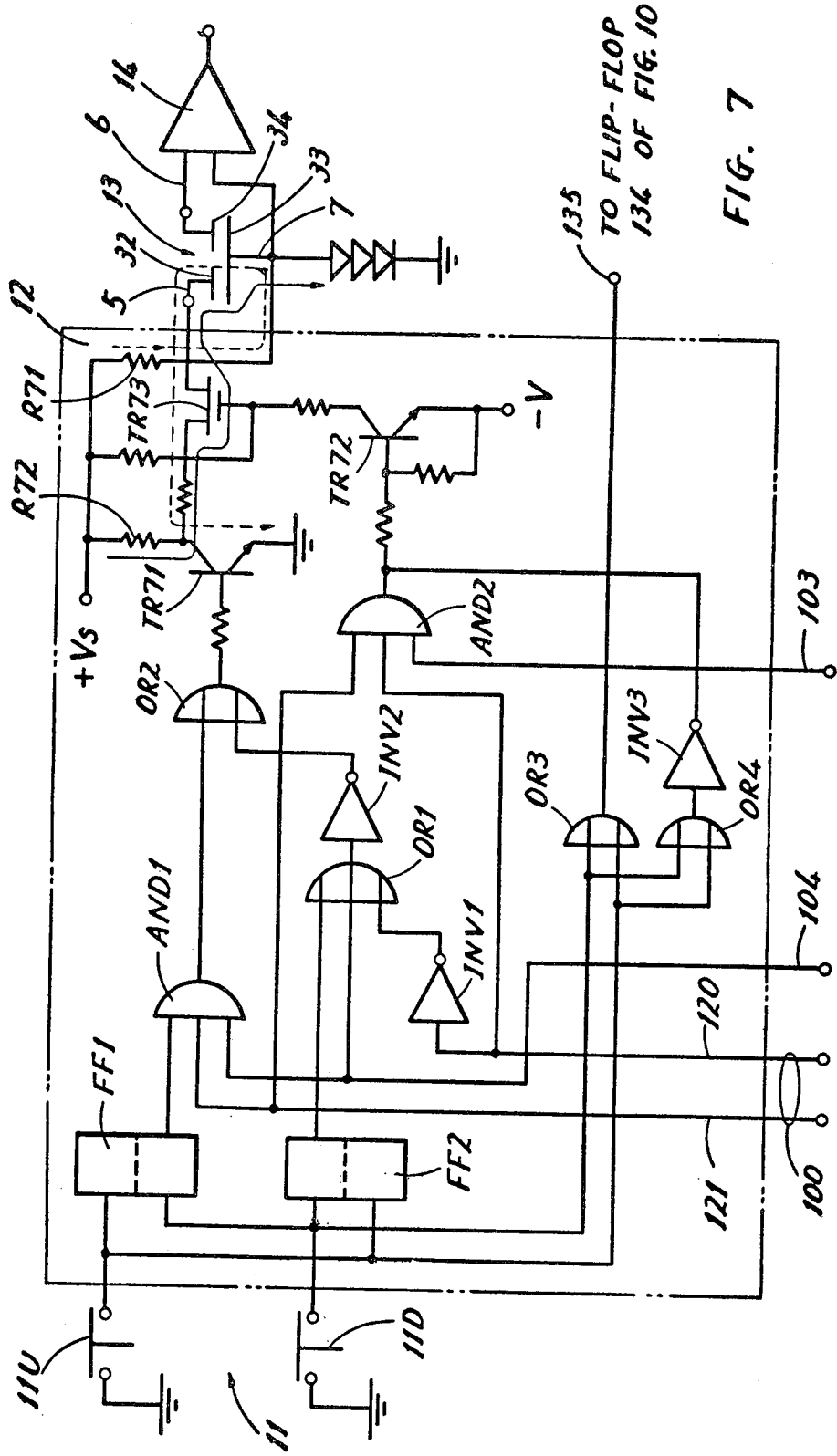
FIG. 7 shows in more detail a schematic diagram of the manually operable switch 11, the charging/discharging control circuit 12, potential memory device 13 and the DC amplifier 14 shown in FIG. 6.

FIG. 7 shows in more detail a schematic diagram of the manually operable switch 11, the charging/discharging control circuit 12, potential memory device 13 and the DC amplifier 14 shown in FIG. 6. As seen from the diagram, depression of the manual switch 11U causes the flip-flop FF1 to be set and the flip-flop FF2 to be reset, and the depression of the manual switch 11D causes the flip-flop FF1 to be reset and the flip-flop FF2 to be set. The line 100 comprises two lines 120 and 121, which comes from FIG. 10, as to be more fully described subsequently. When the apparatus is scanning the lower channel band, i.e. channels 1 to 3 in case of the Japanese Television Standard, the output at the line 104 from the flip-flop 17 is in a low level. As to be described subsequently, both of the outputs at the lines 120 and 121 are in a high level, while the detected frequency is outside the frequency range within which the automatic frequency control is operable. Therefore, if the switch 11U is depressed in such a situation, an output from the flip-flop FF1 becomes a low level, and accordingly an output from the AND gate AND 1 also becomes a low level. The output from the flip-flop FF2 also is in a low level, so that all of the inputs to the OR gate OR 1 are a low level and thus an output from an inverter INV 2 becomes a high level, which makes an output from the OR gate OR2 a high level, so that a transistor TR71 turns on. In that situation, a transistor TR72 is turned off, so that the collector thereof is in a high level and thus a transistor TR73 is turned on. Therefore, a charging current flows through the potential memory device 13 from the anode 33 to the cathode 32 via a resistor R71 and transistors TR73 and TR71 in a direction as shown in a dotted line. On the other hand, when the switch 11D is depressed, the flip-flop FF1 is reset, so that an output therefrom becomes a high level, which is applied as an input to the AND gate AND1. However, one of the inputs to the gate AND1 through the line 104 has been assumed to be a low level. Therefore, an output from the AND gate AND1 is a low level. A high level output is obtained from the flip-flop FF2, which makes the output from the OR gate OR1 a high level, so that a low level output is applied through the OR gate OR2 to the transistor TR71. Accordingly, the transistor TR71 is turned off, which makes a discharging current flow through the potential memory device 13 from the cathode 32 to the anode 33 through a resistor R72 and the transistor TR73 in a direction as shown in a solid line. Thus depression of either the switch 11U or 11D enables the control circuit 12 to be in a charging mode or discharging mode, and thus the channel selector to be scanned accordingly.

Now let it be assumed that in such a situation a broadcasting channel is selected by the channel selector 21. A disabling signal of a high level is obtained at the line 103, as described previously, which is applied to an AND gate AND2. The outputs at the lines 120 and 121 are in a high level at the time of approximate tuning of the channel selector 21. Therefore, all the inputs to the gate AND2 are a high level, so that a high level output is obtained from the AND gate AND2, which makes the transistor TR72 turn on. Conduction of the transistor TR72 causes a negative voltage to be applied from a negative voltage source connected to the emitter to a gate electrode of the transistor TR73, so that the transistor TR73 is turned off, which discontinues a further charging or discharging operation of the potential memory device 13. Depression of either the switch 11U or 11D makes an output from the OR gate OR3 a high level, which is withdrawn via line 135 to the FIG. 10 diagram to reset a flip-flop in the diagram, as to be described subsequently. Similarly, depression of either the switch 11U or 11D makes an output from the OR gate OR4 a high level, which is inverted by an inverter INV3 to supply an inverted low level output to the transistor TR72, so that the transistor TR72 is turned off and thus the transistor TR73 is turned on, so long as either the switch 11U or 11D is kept depressed. Thus the employment of the OR gate OR4 and the inverter INV3 makes it possible for an operator to continue to choose the channels successively so long as he keeps the switch depressed, as desired.

Figure 8:
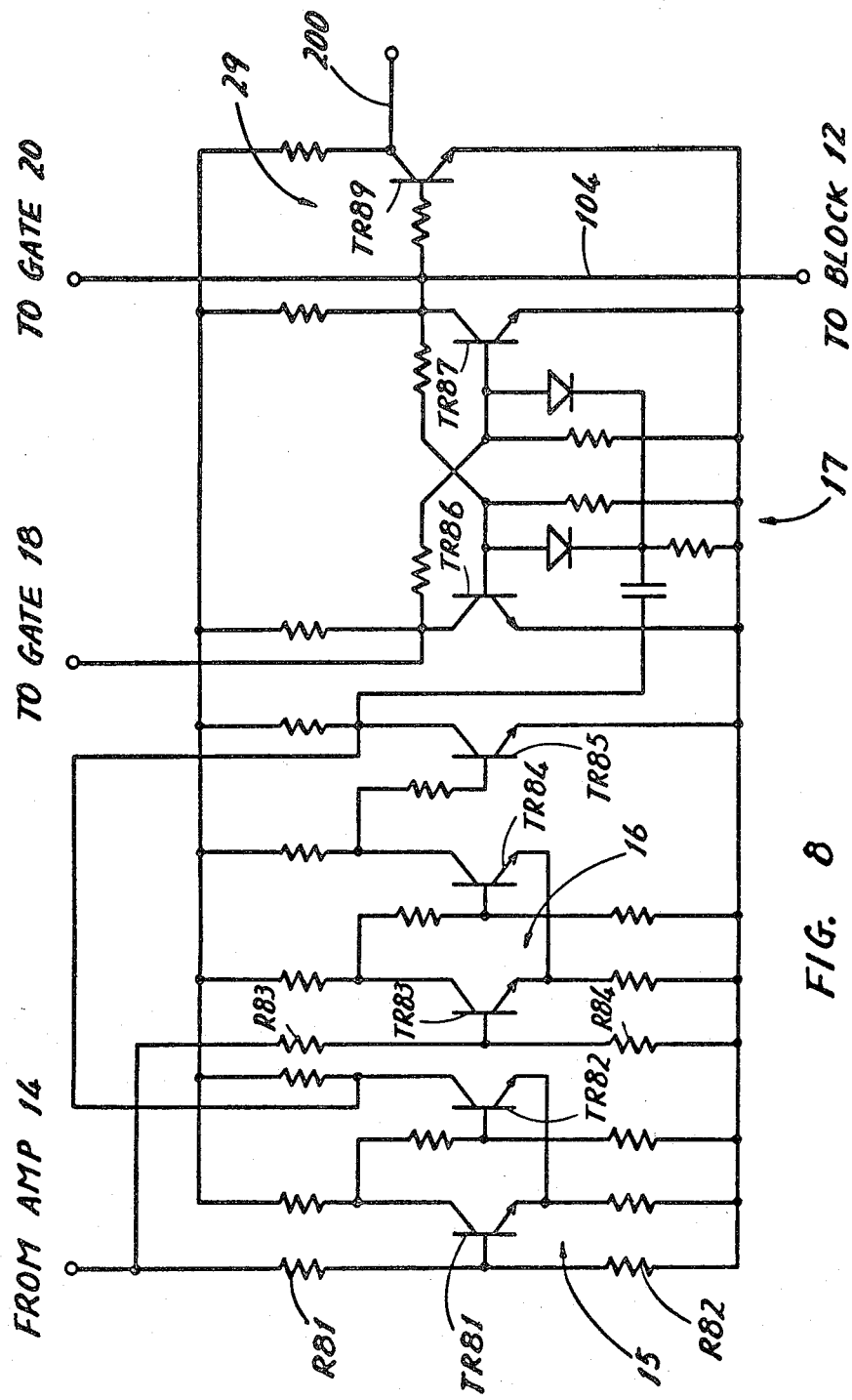
FIG. 8 shows in more detail a schematic diagram of the lower threshold detector 15, the upper threshold detector 16, and the flip-flop 17.

FIG. 8 shows in more detail a schematic diagram of the lower threshold detector 15, the upper threshold detector 16, and the flip-flop 17. The lower threshold detector 15 comprises a pair of transistors TR81 and TR82 connected to implement a Schmidt circuit and resistors R81 and R82 for an input circuit thereof, a ratio of resistance of these resistors being so chosen to determine the said lower threshold. Likewise, the upper threshold detector 16 comprises a pair of transistors TR83 and TR84 connected to implement a Schmidt circuit and resistors R83 and R84 for an input circuit thereof, a ratio of resistance of these resistors being so chosen to determine the said upper threshold. The input of the threshold detectors 15 and 16 is connected from the DC amplifier 14. An output from the threshold detectors 15 and 16 is applied to the flip-flop 17, which is implemented by a pair of transistors TR86 and TR87 connected as well known to those skilled in the art. An output from one half stage of the flip-flop including the transistor TR86 is connected to the gate 18 and an output from the other half stage of the flip-flop 17 is connected to the gate 20 and also to the control circuit 12. The FIG. 8 diagram also comprises the inverter 29, which was discussed in conjunction with the FIG. 4 diagram. The inverter 29 is implemented with a transistor TR89 and the line 200 is withdrawn from the collector thereof.

Figure 9:
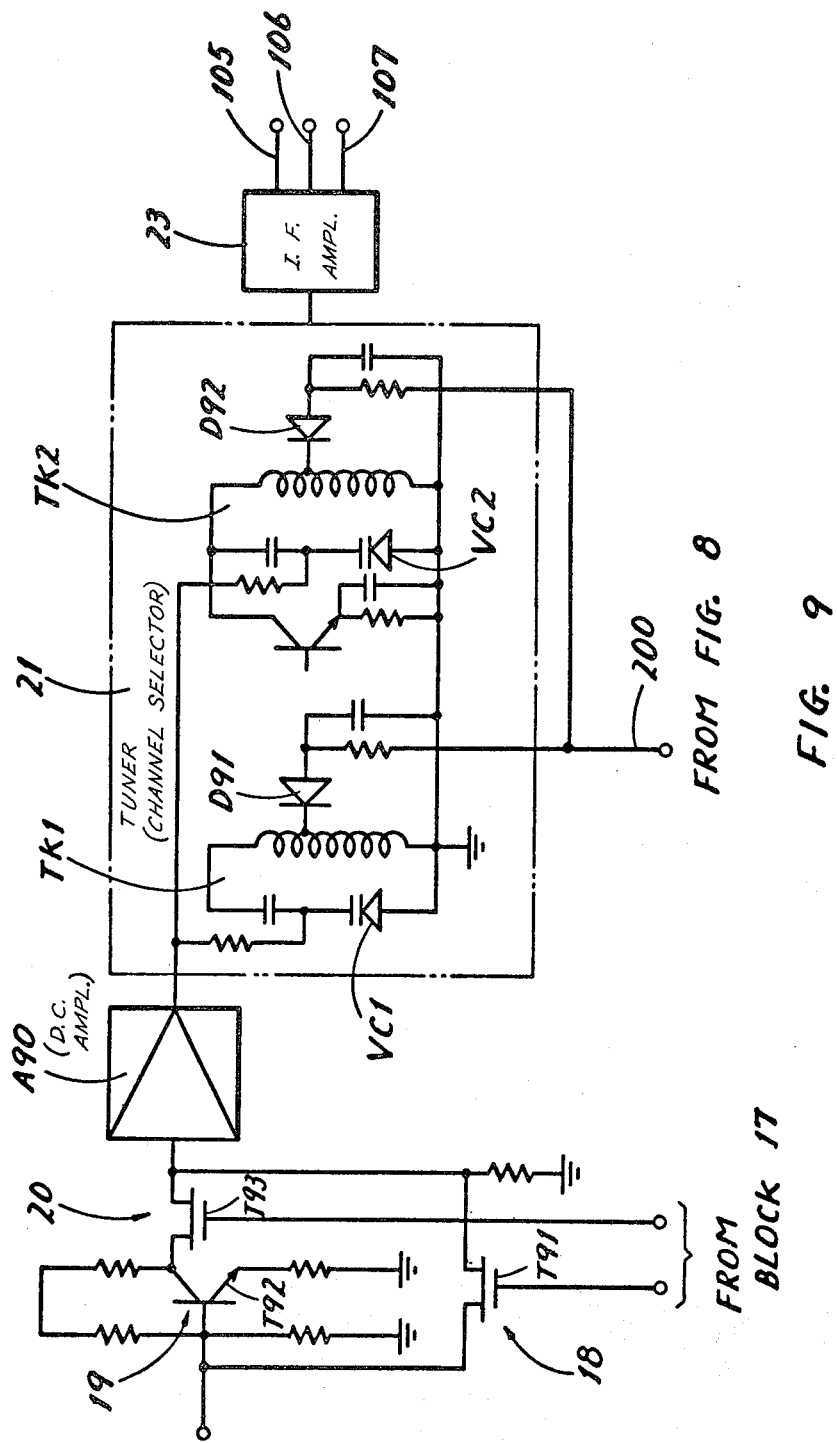
FIG. 9 shows in more detail a schematic diagram of the gate 18, the inverter 19, the gate 20, the channel selector 21, and the intermediate frequency amplifier 23.

FIG. 9 shows in more detail a schematic diagram of the gate 18, the inverter 19, the gate 20, the channel selector 21 and the intermediate frequency amplifier 23. The gates 18 and 20 are implemented using field effect transistors T91 and T93, respectively, and the inverter 19 is implemented by a typical bipolar transistor 19. Gate electrodes of the transistors T91 and T93 are connected to the output of the flip-flop 17. The output of these gates 18 and 20 is connected through a DC amplifier A90 to the channel selector 21. The channel selector 21 comprises a first tuning circuit TK1 for a high frequency amplifier and a second tuning circuit TK2 for a local oscillator. The tuning circuits TK1 and TK2 each comprise voltage controlled variable capacitance diodes VC1 and VC2 as a portion of a capacitance element of the tuning circuit and the output from the DC amplifier A90 is applied to these voltage controlled variable capacitance diodes in a reverse direction. A DC switching signal is applied through switching diodes D91 and D92 to the middle taps of the coils in the tuning circuits TK1 and TK2, respectively, for the purpose of changing the inductance of the coils in these tuning circuits TK1 and TK2 to a smaller value or to a larger value, i.e. changing the frequency of the signal processed in the channel selector 21 to a higher range or to a lower range, so that both the higher frequency channels and the lower frequency channels may be covered by a single set of coils, as described in conjunction with the FIG. 6 diagram. More detailed structure and operation of the channel selector 21 are well known to those skilled in the art. Briefly described, a higher output from the amplifier A90 biases the voltage controlled variable capacitance diode VC1 and VC2 harder in a reverse direction, and thus decreases the capacitance across the junctions of these diodes VC1 and VC2, and as a result makes higher the tuning frequency of the tuning circuits TK1 and TK2, and vice versa. In reception of the lower frequency channels, a low level signal is applied to the line 200 and thus the switching diodes D91 and D92 remains off. However, in reception of the higher frequency channels, a high level signal is applied to the line 200, which causes the diodes D91 and D92 to be biased in a forward direction and thus be turned on, so that the lower half of each coil of the tuning circuits TK1 and TK2 is short circuited by a DC current flowing therethrough by means of the diodes D91 and D92, respectively, with the result that the inductance of the coils of the tuning circuits is reduced and the tuning frequency of the tuning circuits is raised to a higher frequency channel range. The intermediate frequency amplifier 23 is well known to those skilled in the art and therefore it is not believed necessary to describe the amplifier 23 in more detail. It is to be pointed out that the three lines 105, 106 and 107 are connected therefrom.

Figure 10:
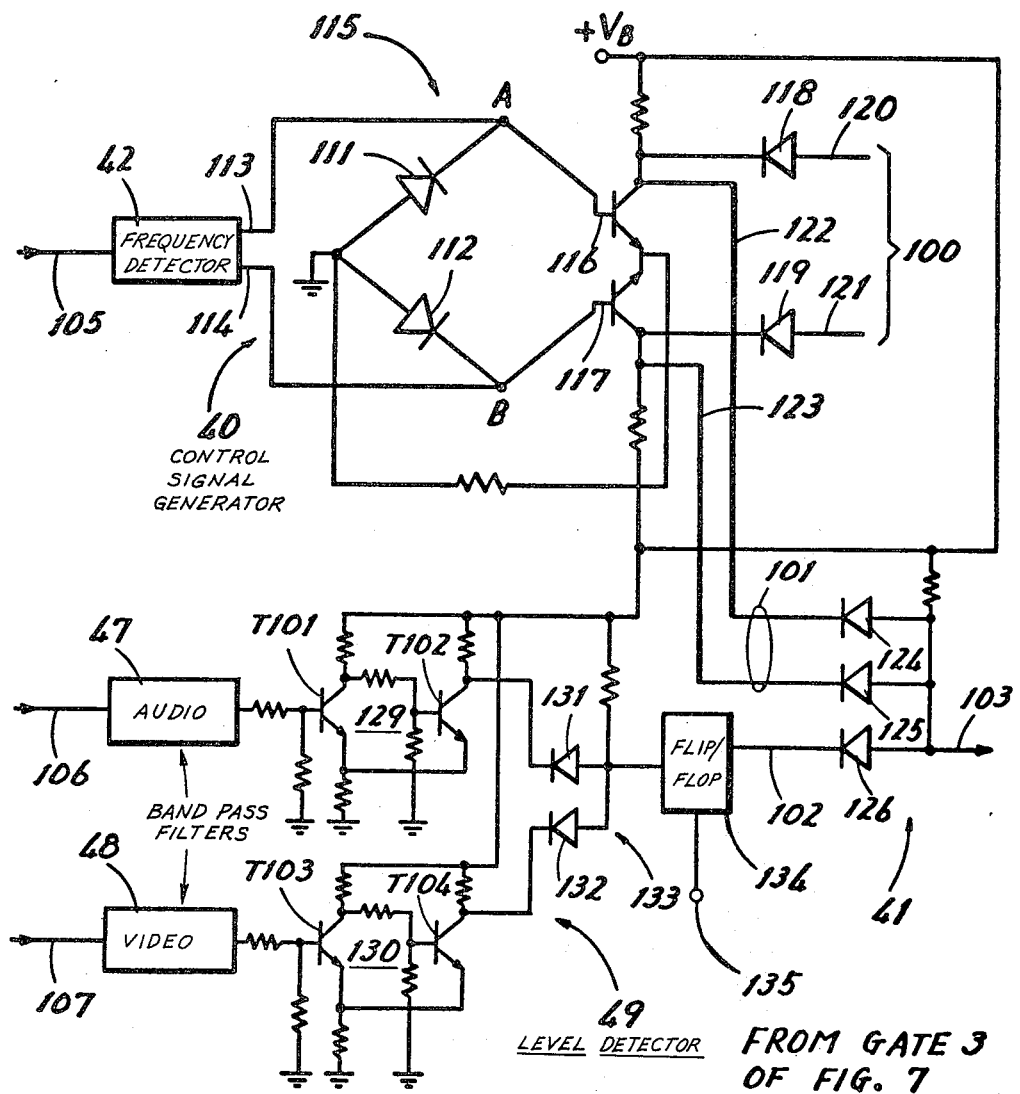
FIG. 10 shows in more detail a schematic diagram of the frequency detector 42, the charging/discharging control signal generating circuit 40, the band-pass filters 47 and 48, the level detector 49 and the AND gate 41.
Figure 11:
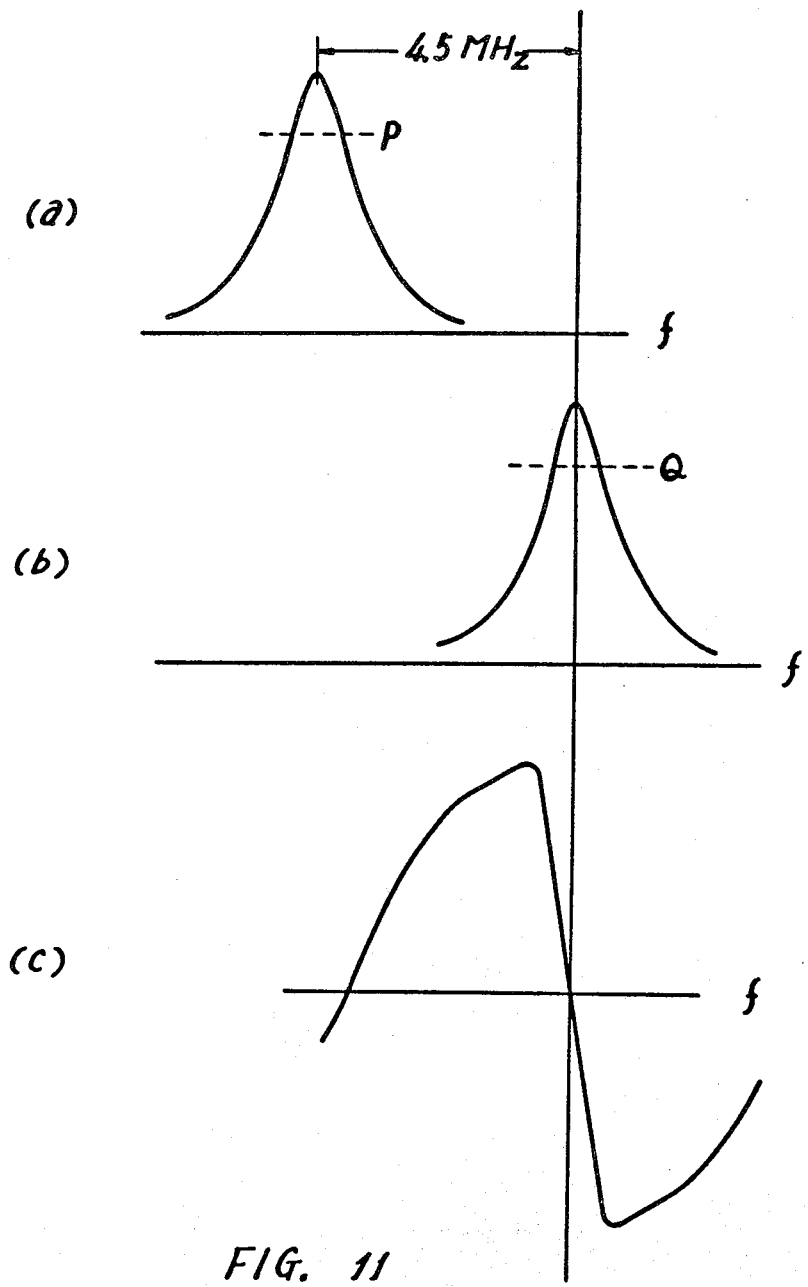
FIG. 11 shows a graph showing a relation between the magnitude of the signals at various portions of FIG. 10 diagram and the frequency.

FIG. 10 shows in more detail a schematic diagram of the frequency detector 42, the charging/discharging control signal generating circuit 40, the band-pass filters 47 and 48, the level detector 49 and the AND gate 41. A detailed description will be made of the FIG. 10 diagram with simultaneous reference to FIG. 11, which shows a graph showing a relation between the magnitude of the signals at various portions of FIG. 10 diagram and the frequency of the signals. The frequency detector 42 receives through the line 105 the intermediate frequency output from the intermediate frequency amplifier 23 and serves to provide equal or balanced small outputs at both output terminals 113 and 114 when the frequency of the intermediate frequency output is a predetermined value and to provide unbalanced outputs at both output terminals 113 and 114 when the frequency of the intermediate frequency output is fluctuated from the said predetermined value. More specifically, the frequency detector 42 provides a higher voltage output at the output terminal 113 and a lower voltage output at the output terminal 114 when the frequency of the intermediate frequency output is fluctuated to a frequency higher than the predetermined value and provides a lower voltage output at the output terminal 113 and a higher voltage output at the output terminal 114 when the frequency of the intermediate frequency output is fluctuated to a frequency lower than the predetermined value. A well known ratio detector may be used as the frequency detector 42. FIG. 11 (c) shows a characteristic curve of such a ratio detector. The output terminals 113 and 114 are connected to junctions A and B of a bridge circuit 115, which comprises a pair of diodes 111 and 112 and a pair of transistors 116 and 117. A junction of the cathode of the diode 111 and a base of the transistor 116 constitutes the junction A and a junction of the cathode of the diode 112 and a base of the transistor 117 constitutes the junction B. A resistor is connected between a junction of the cathodes of the diodes 111 and 112, which is grounded, and a junction of the emitters of the transistors 116 and 117. The collectors of the transistors 116 and 117 are withdrawn through diodes 118 and 119, respectively, in a reverse direction to lines 120 and 121, respectively, generally referred to as the line 100 in FIG. 6 diagram, to provide an automatic frequency control signal, which was referred to as a charging/discharging control signal in the description in conjunction with the FIG. 6 diagram. The collectors of the transistors 116 and 117 are also connected through lines 122 and 123, respectively, which are generally referred to as the line 101 in the description in conjunction with the FIG. 6 diagram, to diodes 124 and 125, respectively, which together with a diode 126 constitute the AND gate 41. The sound band-pass filter 47 for choosing the sound component and the video band-pass filter 48 for choosing the video component, which receive the intermediate frequency output through lines 106 and 107, respectively, are connected to a sound level detector 129 and a video level detector 130, respectively, of the level detector 49. The sound level detector 129 may be a Schmidt circuit using transistors T101 and T102 with an input circuit including resistors for determining a detection level and the video level detector 130 may be a Schmidt circuit using transistors T103 and T104 with an input circuit including resistors for determining a detection level. The outputs from the level detectors 129 and 130 are connected to the cathodes of the diodes 131 and 132, which are connected to form an AND gate 133, an output of which is connected to a flip-flop 134, which is reset by a signal fed through the line 135 from the gate OR3 of the FIG. 7 diagram. The output of the flip-flop 134 is connected to the said diode 126 of the AND gate 41. The characteristic curves of the band-pass filters 47 and 48 are shown in FIG. 11 (a) and (b), respectively.

In operation, an automatic channel selecting operation starts in response to manual operation of the manual switch 11 (FIG. 6), as mentioned previously, so that the sound video components of the intermediate frequency output are withdrawn from the band-pass filters 47 and 48, respectively, when a certain broadcasting channel is selected by the channel selector 21 as a result of application of a proper voltage associated with a terminal voltage of the potential memory device to the voltage controlled variable capacitance diodes VC1 and VC2 (FIG. 6). As seen from the FIG. 11 (a) and (b), the level of the outputs from the band-pass filters 47 and 48 becomes higher according as a more appropriate voltage is applied to the diodes VC1 and VC2 and thus the intermediate frequency becomes nearer the predetermined value. When the level of the outputs from the band-pass filters 47 and 48 exceeds thresholds P and Q of FIG. 11 (a) and (b), respectively, the transistors T101 and T103 of the preceding stage of the level detectors 129 and 130, respectively, turn on and thus the transistors T102 and T104 of the succeeding stage of the level detectors 129 and 130, respectively, turn off, so that the outputs of the level detectors 129 and 130 are kept in a high level. As a result, the diodes 131 and 132 of the AND gate 133 turn off and the anodes of the diodes 131 and 132 become a high level, which means an high level output or an ANDed output from the AND gate 133. Consequently, the flip-flop 134 is set to provide a high level output. When the intermediate frequency comes to be the exact predetermined value in such a condition, the balanced or equal but so small outputs are obtained from the frequency detector 42 that both transistors 116 and 117 turn off to provide a high level output at the lines 122 and 123, which together with a high level output from the flip-flop 134 makes the AND gate 41 provide a high level output therefrom, which is withdrawn through the line 103 as a disabling signal, as described fully in conjunction with the FIG. 6 diagram.

Let it be assumed that in such a condition fluctuation of the intermediate frequency to a lower value or a higher value has taken place for some reason, as the case may be. Then an unbalanced output, such as the higher level at the line 113 and the lower level at the line 114 in the former case and the level at the line 113 and the higher level at the line 114 in the latter case, is obtained between the lines 113 and 114, so that the transistor 116 turns on in the former case and the transistor 117 turns on in the latter case, with the result that the voltage of the collector of the conducting transistor drops substantially to a ground potential. Therefore, in the former case the diode 118 turns on and a charging control signal is obtained at the line 120 and in the latter case the diode 119 turns on and a discharging control signal is obtained at the line 121. In either event an unbalanced output is obtained between the lines 122 and 123 such that in the former case the line 122 becomes a low level and in the latter case the line 123 becomes a low level, with the result that the enabling input condition of AND gate 41 is not established and thus no disabling signal is obtained from the AND gate 41. As described fully in the foregoing in conjunction with the FIG. 7 diagram, the charging control signal from the line 120 forces the control circuit 12 to assume a charging mode and thus the potential memory device 13 is charged, whereas the discharging control signal from the line 121 forces the control circuit 12 to assume a discharging mode and thus the potential memory device 13 is discharged. As the potential memory device 13 is charged or discharged, the output from the device 13 is raised or lowered, respectively, and thus the intermediate frequency is raised or lowered, respectively. When the intermediate frequency becomes closer to the predetermined value, again the outpupt from the frequency detector 41 becomes balanced and small and thus the bridge circuit 115 becomes in a balanced condition, so that both the transistors 116 and 117 turn off. As a result no control signal output is obtained at the lines 120 and 121, while the disabling signal is obtained at the line 103, so that the control circuit 12 is disabled to discontinue further charging of the potential memory device 13.

Some detailed description will be made in the following of an advantage of employing simultaneous level detection of two components, such as sound and video, of the intermediate frequency output for the purpose of providing a disabling signal. Now the fourth channel of the television channels of the Japanese Television Standard is considered by way of example. The frequency of the video carrier wave (FV) is 171.25MHZ and the frequency of the sound carrier wave (Fs) is 175.75MHZ for the fourth channel. Therefore, if the frequency of the local oscillator (Fo) becomes 230MHZ, the intermediate frequency (video) of 58.75MHZ is obtained by way of a difference between Fo and Fv in accordance with the following equation.

$$Fo - Vv = 230MHZ - 171.25MHZ = 58.75MHZ$$

On the other hand, when the frequency of the local oscillator (Fo) becomes 234.50MHZ, a pseudo video intermediate frequency of 58.75MHZ is obtained by way of a difference between Fo and Fs in accordance with the following equation.

$$Fo - Fs = 234.50MHZ - 175.75MHZ = 58.75MHZ$$

Therefore, if the automatic frequency control system had been so constructed that a disabling signal is obtainable only in response to the video component of the intermediate frequency output, it could happen that an undesired frequency is tuned erroneously by the channel selector besides the desired proper frequency of the channel to be selected. However, in the embodiment shown, an output of simultaneous level detection of both the sound and the video components of the intermediate frequency, i.e. a logical product output of the sound and video intermediate frequencies, is used to provide a disabling signal to the charging/discharging circuit, and therefore the abovementioned disadvantage can be eliminated. As pointed out previously, a synchronizing pulse output may also be used in lieu of either the sound or video component of the intermediate frequency output, in view of the fact that synchronizing pulse output is obtainable only in the event the frequency is properly tuned by the channel selector.

In the foregoing the embodiments of the present invention have been described as embodied in the television receiver. However, it is apparent that the present invention can be embodied in conjunction with any equipment comprising a tuning apparatus, such as an AM radio receiver, FM radio receiver, and the like. It would further be possible to make many changes and modifications of the present invention without departing from the spirit and scope of the present invention. Therefore, it is intended that the true scope of the present invention is covered only by the appended claims.

What is claimed is:
1. An automatic tuning apparatus comprising:
 a solid state electrochemical potential memory device comprising:
  a cathode including an active metal,
  an anode comprising an alloy including said metal, and
  a solid state electrolyte having high ion conductivity sandwiched between said cathode and said anode, said potential memory device exhibiting a terminal voltage betweeen said anode and said cathode linearly changing as a functionn of the charging or discharging quantity of electricity supplied to said device by a flow of current therethrough selectively in a charging or discharging direction, respectively, tuning means comprising a voltage controlled variable reactance device and means responsive to said terminal voltage of said potential memory device for generating a control voltage and supplying said generated control voltage to said device, whereby the tuning frequency of said tuning means is controlled by said control voltage as a function of said terminal voltage of said potential memory device,
 means coupled to said tuning means for providing a signal indicative of the degree of tuning of said tuning means,
 first means coupled to said means for providing said tuning degree indicating signal for threshold detecting said tuning degree indicating signal at a predetermined threshold level and producing a threshold detected output signal,
 second means coupled to said tuning means for providing an output signal indicative of the relationship of the tuning frequency of said tuning means with respect to a predetermined frequency, means responsive to said output from said second means for providing first and second correction signal outputs for respectively increasing and decreasing the tuning frequency of said tuning means to correct for a difference thereof with respect to said predetermined frequency, and producing a third output signal when said tuning frequency has a predetermined relationship to said predetermined frequency, means responsive to simultaneous outputs from said first means and said frequency correcting signal providing means for providing an output which is a logical product of said output signal from said first means and said third output signal of said frequency correcting signal providing means, means for selectively producing first and second tuning direction selection output signals for selectively increasing and decreasing the tuning frequency of said tuning means, means for selectively supplying a flow of current through said potential memory device, including:
means responsive selectively to said first and second output signals of each of said tuning direction selection output signal means and said correction output signal providing means to control the flow of current to said potential memory device in the corresponding one of said opposite directions for increasing and decreasing, respectively, the tuning frequency of said tuning means, and switching means connected in series with said potential memory device, said switching means being rendered non-conductive in response to the presence of said logical product output signal to prevent a flow of current through said potential memory device, and being rendered conductive in response to either of said first and second tuning direction selection output signals or the absence of said logical product signal to permit a flow of current through said potential memory device.

2. The automatic tuning apparatus in accordance with claim 1, in which said cathode comprises
a main cathode including an active metal connected to said current providing means, and
an auxiliary cathode including an active metal connected to said voltage controlled variable reactance device.

3. The automatic tuning apparatus in accordance with claim 1, in which the cathode of said device includes Ag and the anode thereof includes an alloy of Ag and a chalcogen element.

4. The automatic tuning apparatus in accordance with claim 1, which further comprises means for enabling said current providing means.

5. The automatic tuning apparatus in accordance with claim 4, in which said enabling means is a manual switch.

6. The automatic tuning apparatus in accordance with claim 1, in which said tuning means is a channel selector for a television receiver.

7. The automatic tuning apparatus in accordance with claim 1, wherein said control voltage generating means comprises:
means for threshold detecting said terminal voltage between the anode and cathode of said potential memory device at a predetermined upper limit threshold and producing a corresponding, detected output,
means for threshold detecting said terminal voltage between the anode and said cathode of said potential memory device at a predetermined lower limit threshold and producing a corresponding, detected output,
means responsive to one of said upper and lower threshold limit detected outputs for generating said control voltage as a function of said terminal voltage directly, and
means responsive to the other of said upper and lower limit threshold detected outputs and including inverter means for inverting said terminal voltage and generating said control voltage as a function of said inverted terminal voltage.

8. The automatic tuning apparatus in accordance with claim 7, which further comprises
storing means having first and second states and responsive to one of said upper and lower limit threshold detected outputs for storing one state and responsive to the other of said upper and lower limit threshold detected output for storing a different state, said supplying means being responsive to said one and said different states of said storing means, respectively.

9. The automatic tuning apparatus in accordance with claim 8, which further comprises
means responsive to said one or the other of said upper and lower limit threshold detected outputs for shifting the frequency range to be covered by said tuning means.

10. The automatic tuning apparatus as recited in claim 1, wherein said series connection of said switching means and said potential memory device include corresponding first and second end terminals, and wherein said means for selectively supplying a current flow through said potential memory device further comprises:
first and second voltage supply terminals of opposite polarity,
unidirectional conducting means connecting one of said end terminals to one of said voltage supply terminals,
first and second current conducting means connecting said first and second end terminals of said series connection to the other of said voltage supply terminals, and
further switching means connecting said other end terminal of said series connection to said other voltage supply terminal, said further switching means, when conductive, connecting said other end terminal of said series connection to said one voltage supply terminal to control the flow of current through said series connection from said other voltage supply terminal through one of said current conducting means, said series connection, and said unidirectional conducting means to said one voltage supply terminal and, when rendered non-conductive, controlling said flow of current through said series connection from said other voltage supply terminal, the other of said current conducting means, said series connection and said further switching means to said one voltage supply terminal, said further switching means being responsive selectively to said first and second output signals of each of said tuning direction selection output signal means and said correction output signal providing means to be rendered selectively conductive and non-conductive thereby to control the said flow of current in the corresponding one of said opposite directions for increasing and decreasing, respectively, the tuning frequency of said tuning means.

11. An automatic tuning apparatus comprising:

a solid state electrochemical potential memory device comprising:
  a cathode including an active metal,
  an anode comprising an alloy including said metal, and
  a solid state electrolyte having high ion conductivity sandwiched between said cathode and said anode,
  said potential memory device exhibiting a terminal voltage between said anode and said cathode linearly changing as a function of the charging or discharging quantity of electricity supplied to said device by a flow of current therethrough selectively in a charging or discharging direction, respectively,
tuning means comprising a voltage controlled variable reactance device and means responsive to said terminal voltage of said potential memory device for generating a control voltage and supplying said generated control voltage to said device, whereby the tuning frequency of said tuning means is controlled by said control voltage as a function of said terminal voltage of said potential memory device,
means coupled to said tuning means for providing a signal indicative of the degree of tuning of said tuning means,
first means coupled to said means for providing said tuning degree indicating signal for threshold detecting said tuning degree indicating signal at a predetermined threshold level and producing a threshold detected output signal,
second means coupled to said tuning means for providing an output signal indicative of the relationship of the tuning frequency of said tuning means with respect to a predetermined frequency,
means responsive to said output from said second means for providing first and second correction signal outputs for respectively increasing and decreasing the tuning frequency of said tuning means to correct for a difference thereof with respect to said predetermined frequency, and producing a third output when said tuning frequency has a predetermined relationship to said predetermined frequency,
means rsponsive to simultaneous outputs from said first means and said frequency correcting signal providing means for providing an output which is a logical product of said output signal from said first means and said third output signal of said frequency correcting signal providing means,
means for threshold detecting the control voltage at a predetermined threshold and producing a threshold detected output,
means for selectively supplying a flow of current through said potential memory device, including:
  means responsive selectively to said first and second output signals to control the flow of current to said potential memory device in the corresponding one of said opposite directions for increasing and decreasing, respectively, the tuning frequency of said tuning means, and to said threshold detected output to reverse the direction of current flow from a present one to the opposite one of said directions, and
  switching means connected in series with said potential memory device, said switching means being rendered non-conductive in response to the presence of said logical product output signal to prevent a flow of current through said potential memory device.

12. The automatic tuning apparatus in accordance with claim 11, which further comprises
  means responsive to said reversing means for shifting the range of tuning frequencies covered by said tuning means.

13. The automatic tuning apparatus in accordance with claim 11, in which said cathode comprises
  a main cathode including an active metal connected to said current providing means, and
  an auxiliary cathode including an active metal connected to said voltage controlled variable reactance device.

14. The automatic tuning apparatus in accordance with claim 11, in which the cathode of said device includes Ag and the anode thereof includes an alloy of Ag and a chalcogen element.

15. The automatic tuning apparatus in accordance with claim 11, which further comprises
  means for enabling said current providing means.

16. The automatic tuning apparatus in accordance with claim 15, in which said enabling means is a manual switch.

17. An automatic tuning apparatus comprising:
  a solid state electrochemical potential memory device comprising:
    a cathode including an active metal,
    an anode comprising an alloy including said metal, and
    a solid state electrolyte having high ion conductivity sandwiched between said cathode and said anode,
    said potential memory device exhibiting a terminal voltage between said anode and said cathode linearly changing as a function of the charging or discharging quantity of electricity supplied to said device by a flow of current therethrough selectively in a charging or discharging direction, respectively,
  tuning means comprising a voltage controlled variable reactance device and means responsive to said terminal voltage of said potential memory device for generating a control voltage and supplying said generated control voltage to said device, whereby the turning frequency of said tuning means is controlled by said control voltage as a function of said terminal voltage of said potential memory device,
  means coupled to said tuning means for providing a signal indicative of the degree of tuning of said tuning means,
  first means coupled to said means for providing said tuning degree indicating signal for threshold detecting said tuning degree indicating signal at a predetermined threshold level and producing a threshold detected output signal,
  second means coupled to said tuning means for providing an output signal indicative of the relationship of the tuning frequency of said tuning means with respect to a predetermined frequency,
  means responsive to said output from said second means for providing first and second correction signal outputs for respectively increasing and decreasing the tuning frequency of said tuning means to correct for a difference thereof with respect to said predetermined frequency, and producing a third output when said tuning frequency has a predetermined relationship to said predetermined frequency, means responsive to simultaneous outputs from said first means and said frequency correcting signal providing means for providing an output which is a logical product of said output signal from said first means and said third output signal from said frequency correcting signal providing means, means for threshold detecting the control voltage at a predetermined upper limit threshold and producing an upper limit threshold detected output, means for selectively supplying a flow of current through said potential memory device, including:

means responsive selectively to said firsts and second correction output signals to control the flow of current to said potential memory device in the corresponding one of said opposite directions for increasing and decreasing, respectively, the tuning frequency of said tuning means, and to said upper limit threshold detected output to reverse the direction of current flow from a present one to the opposite one of said directions, switching means connected in series with said potential memory device, said switching means being rendered non-conductive in response to the presence of said logical product output signal to prevent a flow of current through said potential memory device, and being rendered conductive in response to the absence of said logical product signal to permit a flow of current through said potential memory device, and said control voltage generating means including inverting means enabled in response to said upper limit threshold output for generating the control voltage as a function of the inverted terminal voltage, thereby to generate said control voltage as changing from a lower limit to an upper limit and correspondingly changing the tuning frequency from a lower limit to an upper limit upon each said upper limit threshold detected output.

18. The automatic tuning apparatus in accordance with claim 17 in which said cathode comprises
a main cathode including an active metal connected to said current providing means, and
an auxiliary cathode including an active metal connected to said voltage controlled variable reactance device.

19. The automatic tuning apparatus in accordance with claim 17, in which the cathode of said device includes Ag and the anode thereof includes an alloy of Ag and a chalcogen element.

20. The automatic tuning apparatus in accordance with claim 17, which further comprises
means for enabling said current providing means.

21. The automatic tuning apparatus in accordance with claim 20, in which said enabling means is a manual switch.

22. An automatic tuning apparatus comprising:
a solid state electrochemical potential memory device comprising:
a cathode including an active metal,
an anode comprising an alloy including said metal, and
a solid state electrolyte having high ion conductivity sandwiched between said cathode and said anode,
said potential memory device exhibiting a terminal voltage between said anode and said cathode linearly changing as a function of the charging or discharging quantity of electricity supplied to said device by a flow of current therethrough selectively in a charging or discharging direction, respectively, tuning means comprising a voltage controlled variable reactance device and means responsive to said terminal voltage of said potential memory device for generating a control voltage and supplying said generated control voltage to said device, whereby the tuning frequency of said tuning means is controlled by said control voltage as a function of said terminal voltage of said potential memory device, means coupled to said tuning means for providing a signal indicative of the degree of tuning of said tuning means, said means coupled to said means for providing said tuning degree indicating signal for threshold detecting said tuning degree indicating signal at a predetermined threshold level and producing a threshold detected output signal, second means coupled to said tuning means for providing an output signal indicative of the relationship of the tuning frequency of said tuning means with respect to a predetermined frequency, means responsive to said output from said second means for providing first and second correction signal outputs for respectively increasing and decreasing the tuning frequency of said tuning means to correct for a difference thereof with respect to said predetermined frequency, and producing a third output when said tuning frequency has a predetermined relationship to said predetermined frequency, means responsive to simultaneous outputs from said first means and said frequency correcting signal providing means for providing an output which is a logical product of said output signal from said first means and said third output signal of said frequency correcting signal providing means, means for threshold detecting said terminal voltage between the anode and cathode of said potential memory device at a predetermined upper limit threshold and producing a corresponding, detected output, means for threshold detecting said terminal voltage between the anode and auxiliary cathode of said potential memory device at a predetermined lower limit threshold and producing a corresponding, detected output, means for selectively supplying a flow of current through said potential memory device, including:

means responsive selectively to said first and second correction output signals to control the flow of current to said potential memory device in the corresponding one of said opposite directions for increasing and decreasing, respectively, the tuning frequency of said tuning means, and to said upper and lower limit threshold detected output corresponding to reverse the direction of current flow from a present one, respectively of said directions, switching means connected in series with said potential memory device, said switching means being rendered non-conductive in response to the presence of said logical product output signal to prevent a flow of current through said potential memory device, and being rendered conductive in response to the absence of said logical product signal to permit a flow of current through said potential memory device, and said control voltage generating means including inverting means enabled in response to one of said threshold detected outputs for generating the control voltage as a function of the inverted terminal voltage, and disabled in response to the other of said threshold detected outputs to generate the control voltage as a direct function of the terminal voltage.

23. The automatic tuning apparatus in accordance with claim 22, which further comprises:
store means having first and second states responsive to one of said upper and lower limit threshold detected outputs for storing one state and responsive to the other of said upper and lower limit threshold detected outputs for storing the other state, said inverting means being enabled and disabled in response to said one and said other states of said store means, respectively.

24. The automatic tuning apparatus in accordance with claim 23, wherein said tuning means has first and second ranges of tuning frequencies, and which further comprises
means selectively responsive to said upper and lower limit threshold detected outputs for controlling said tuning means to select the corresponding one of said frequency ranges.

25. The automatic tuning apparatus in accordance with claim 22, in which said cathode comprises
a main cathode including an active metal connected to said current providing means, and
an auxiliary cathode including an active metal connected to said voltage controlled variable reactance device.

26. The automatic tuning apparatus in accordance with claim 22, in which the cathode of said device includes Ag and the anode thereof includes an alloy of Ag and a chalcogen element.

27. The automatic tuning apparatus in accordance with claim 22, which further comprises
means for enabling said current providing means.

28. The automatic tuning apparatus in accordance with claim 27, in which said enabling means is a manual switch.

29. An automatic tuning apparatus comprising:
a solid state electrochemical potential memory device comprising:
a cathode including an active metal,
an anode comprising an alloy including said metal, and
a solid state electrolyte having high ion conductivity sandwiched between said cathode and said anode,
said potential memory device exhibiting a terminal voltage between said anode and said cathode linearly changing as a function of the charging or discharging quantity of electricity supplied to said device by a flow of current therethrough selectively in a charging or discharging direction, respectively,
tuning means comprising a voltage controlled variable reactance device connected to be supplied with a voltage associated with said terminal voltage of said potential memory device, whereby a tuning frequency of said tuning means is dependent on said terminal voltage of said potential device, means coupled to said tuning means for providing a signal indicative of the degree of tuning of said tuning means,
first means coupled to said means for providing said tuning degree indicating signal for threshold detecting said tuning degree indicating signal at a predetermined threshold level and producing a threshold detected output signal,
second means coupled to said tuning means for providing an output signal indicative of the relationship of the tuning frequency,
frequency correcting signal providing means responsive to said output from said second means for providing a control signal output for correcting the relationship of the tuning frequency of said tuning means with respect to said predetermined frequency,
means responsive to simultaneous outputs from said first means and said frequency correcting signal providing means for providing an output which is a logical product of said output signals from said first means and said frequency correcting signal providing means,
first tuning direction selection means for producing a first tuning direction selection output for selecting a change in the tuning frequency of said tuning means toward a higher frequency,
second tuning direction selection means for producing a second tuning direction selection output for selecting a change in the tuning frequency of said tuning means toward a lower frequency,
means for selectively providing a flow of current through said potential memory device, including:
means responsive to an output from either said first or second tuning direction selection means or from said frequency correcting signal providing means for correspondingly selecting the direction of said flow of current through, and the resultant charging or discharging of, said potential memory device, the changing terminal voltage thereof causing a change in reactance of said voltage controlled reactance device and thus a change in a tuning frequency of said tuning means in the corresponding, selected direction, and
switching means connected in series with said potential memory device, said switching means being rendered conductive in response to an output from either said first or second direction selection means or the absence of said logical product output from said logical product output providing means for allowing the flow of current through said potential memory device and being rendered non-conductive in response to the presence of said logical product output for discontinuing the flow of current through said potential memory device.

30. The automatic tuning apparatus in accordance with claim 29, in which said means for selecting the direction of said flow of current further comprises:
means for providing a first voltage to one end of said series connection of said potential memory device and said switching means,
means for providing a second voltage to the other end of said series connection of said potential memory device and said switching means, and
second switching means connected to said one end, said second switching means being rendered conductive in response to an output of one of said first and second direction selection means and in response to an output of said frequency correcting signal providing means indicative of a first relationship of the tuning frequency of said tuning means with respect to said predetermined frequency, thereby causing a potential difference of a first sense across said series connection, and said second switching means being rendered conductive in response to an output of the other of said first and second direction instructing means and an output of said frequency correcting signal providing means indicative of a second, opposite relationship of the tuning frequency of said tuning means with respect to said predetermined frequency, thereby causing a potential difference of a second, opposite sense across said series connection, thereby to select the direction of flow of current through said potential memory device.

* * * * *

UNITED STATES PATENT AND TRADEMARK OFFICE
CERTIFICATE OF CORRECTION

PATENT NO. : 3,965,288
DATED : June 22, 1976
INVENTOR(S) : Yasuhiro Yamada, Kazuyoshi Tsukamoto, Yoshiaki Sakauchi, Takashi Tamura and Yukio Saito It is certified that error appears in the above-identified patent and that said Letters Patent are hereby corrected as shown below:

At [75], change "Kazuyoski" to --Kazuyoshi--;
Column 2, line 19, change "3,735,110" to --3,753,110--.
Column 3, line 34, cahnge "combined be" to --be combined--.
Column 8, line 5, change "IIV" to --IIU--.
Column 16, line 35, change "(Fig. 6)" to --(Fig. 9)--.

Signed and Sealed this

Fifth Day of October 1976

[SEAL]

Attest:

RUTH C. MASON
Attesting Officer

C. MARSHALL DANN
Commissioner of Patents and Trademarks